United States Patent
Frederick et al.

(10) Patent No.: US 7,212,117 B2
(45) Date of Patent: May 1, 2007

(54) AUTOMATIC WIRELESS SYNCHRONIZATION OF ELECTRONIC ARTICLE SURVEILLANCE SYSTEMS

(75) Inventors: Thomas J. Frederick, Coconut Creek, FL (US); Jeffrey T. Oakes, Boca Raton, FL (US)

(73) Assignee: Sensormatic Electronics Corporation, Boca Raton, FL (US)

( * ) Notice: Subject to any disclaimer, the term of this patent is extended or adjusted under 35 U.S.C. 154(b) by 879 days.

(21) Appl. No.: 10/056,947

(22) Filed: Jan. 25, 2002

(65) Prior Publication Data

US 2002/0135480 A1    Sep. 26, 2002

Related U.S. Application Data

(60) Provisional application No. 60/269,425, filed on Feb. 8, 2001.

(51) Int. Cl.
   *G08B 13/14* (2006.01)
(52) U.S. Cl. .................. 340/572.1; 340/506; 340/10.1; 375/356; 375/376
(58) Field of Classification Search ...................... None
   See application file for complete search history.

(56) References Cited

U.S. PATENT DOCUMENTS

| | | |
|---|---|---|
| 4,106,007 A * | 8/1978 | Johnston et al. ............ 375/259 |
| 4,622,543 A | 11/1986 | Anderson et al. |
| 4,658,241 A | 4/1987 | Torre |
| 4,667,185 A | 5/1987 | Nourse et al. |
| 4,675,658 A | 6/1987 | Anderson et al. |
| 4,797,659 A | 1/1989 | Larsen |
| 5,023,600 A | 6/1991 | Szklany et al. |
| 5,051,727 A * | 9/1991 | Fockens .................. 340/572.4 |
| 5,276,430 A * | 1/1994 | Granovsky ............... 340/572.4 |
| 5,337,040 A | 8/1994 | Kind |
| 5,353,011 A * | 10/1994 | Wheeler et al. ......... 340/572.4 |
| 5,371,490 A * | 12/1994 | Martinides ............... 340/572.4 |
| 5,608,765 A | 3/1997 | Tanoue |
| 5,699,045 A * | 12/1997 | Frederick et al. ........... 340/551 |
| 5,995,002 A * | 11/1999 | Fallin et al. ................ 340/505 |
| 6,201,469 B1 | 3/2001 | Balch et al. |
| 6,320,507 B1 * | 11/2001 | Strzelec et al. .......... 340/572.1 |

* cited by examiner

Primary Examiner—Benjamin C. Lee

(57) ABSTRACT

A distributed wireless phase locked loop system for synchronizing the transmit carrier's modulating waveform, such as the transmitter pulse timing in a pulsed EAS system and the transmit sweeping function for swept RF synchronization, is provided. To remove the effect of phase noise on the power line signal, a phase locked loop is used to filter this signal. The filtered output is used as a reference to a second phase locked loop tied to a numerically controlled oscillator and the received signal to provide a distributed phase looked loop algorithm that is wireless, and automatically synchronizes adjacent EAS systems.

7 Claims, 9 Drawing Sheets

AUTOMATIC WIRELESS SYNCHRONIZATION OF ELECTRONIC ARTICLE SURVEILLANCE SYSTEMS

CROSS REFERENCES TO RELATED APPLICATIONS

This application claims the benefit of U.S. Provisional Application No. 60/269,425, filed Feb. 8, 2001.

STATEMENT REGARDING FEDERALLY SPONSORED RESEARCH OR DEVELOPMENT

Not Applicable

BACKGROUND OF THE INVENTION

1. Field of the Invention

This invention relates to the operation of multiple electronic article surveillance (EAS) systems, and more particularly the wireless synchronization of EAS systems operating in the same vicinity of each other.

2. Description of the Related Art

EAS systems in close proximity often must be carefully synchronized to avoid adverse interactions. There are several different levels of synchronization possible. The transmitter's carrier oscillator can be synchronized, or the transmitter's modulating waveform can be synchronized. In more complex systems, such as those sold by Sensormatic Electronics Corporation under the trademark ULTRA*MAX, the transmitter configuration sequence can be synchronized between multiple systems.

U.S. Pat. No. 6,201,469, issued Mar. 13, 2001, by Sensormatic Electronics Corporation, covers synchronization of the transmitter configuration sequence. Synchronizing the transmitter sequence is important for EAS systems that are in very close proximity to each other such that their interrogation zones overlap. As disclosed in that application, the transmit burst timing is tied directly to the power line zero crossing function, for which the phase is manually adjusted.

There is a need for synchronizing the transmit carrier's modulating waveform for EAS systems in close proximity, even if their interrogation zones are not overlapping. In swept RF systems this means synchronizing the sweeping function between multiple transmitters. In pulsed systems, such as ULTRA*MAX, this means synchronizing the transmitter pulse function between multiple systems.

Pulsed EAS systems positioned within hundreds of feet of one another must have their transmit burst timing precisely aligned or the transmitters will interfere with one another's receivers, decreasing sensitivity or causing false alarms. In prior systems this has been accomplished by using the three phases of the power line for synchronization. Each system is plugged into the 60 (or 50) hertz power system, which is divided into three phases. Each phase is a sinusoidal function nominally offset from one another by $\frac{1}{180}$ of a second (or $\frac{1}{150}$ of a second for 50 hertz systems) apart. The zero crossing of the power line is used as a timing reference, assuming that this $\frac{1}{180}$ second separation is correct. However, due to variations of loading conditions across the three phases of the power line, often they are not exactly spaced $\frac{1}{180}$ seconds apart. This causes the systems to interfere with each other, which in turn causes a service call to local technicians. The technicians must come and manually adjust the timing of the systems. If loading conditions on the power lines change, the process repeats itself at great expense to the company.

Another problem with using the power line as a timing reference is that the power line is not necessarily sufficiently stable. In particular, the zero crossing has a significant amount of phase noise. This phase noise is translated directly to timing jitter on the system transmitters. Since the phase noise on the three line phases may not be correlated, the jitter experienced by multiple systems compounds the problem.

In swept RF systems whose interrogation zones overlap, interference of the two transmit signals can cause decreased performance. In the worst case, one transmitter may be sweeping low while the other is high, and visa versa. The envelope of the two transmitters (i.e., the carrier's modulating function) must be synchronized for best performance.

Synchronization of adjacent EAS systems can be accomplished by hardwiring the systems so that timing of each EAS system can be precisely controlled. Hardwiring of adjacent EAS systems is not always feasible or cost effective. Manual adjustment coupled to and power line zero crossings include the limitations described hereinabove. A wireless, automatic method of synchronizing the transmit carrier's modulating waveform for an EAS system is needed.

BRIEF SUMMARY OF THE INVENTION

The disclosed invention is a distributed wireless phase locked loop system for synchronizing the transmit carrier's modulating waveform, such as the transmitter pulse timing in a pulsed EAS system and the transmit sweeping function for swept RF synchronization. To remove the effect of phase noise on the power line signal, a phase locked loop is used to filter this signal. The filtered output is used as a reference to a second dependent phase locked loop tied to a numerically controlled oscillator and the received signal to provide a distributed phase looked loop algorithm that is wireless, and automatically synchronizes adjacent EAS systems.

In one aspect of the present invention, an apparatus and method for wireless synchronization of electronic article surveillance systems reduces the need for manual adjustment of transmitter timing by continually adapting and updating timing automatically to changing environmental conditions. The apparatus and method includes a first phase locked loop that is responsive to a power line zero crossing for detecting a line phase error. A first numerically controlled oscillator is responsive to the line phase error and to a crystal oscillator. The first numerically controlled oscillator has a reference output, which is an input to the line phase error detector. A second phase locked loop is responsive to a transmit signal from a first electronic article surveillance system for detecting a transmit phase error. A second numerically controlled oscillator is responsive to the transmit phase error and the reference output, and has a synchronized transmit output, that is input to the transmit phase error detector. The synchronized transmit output is usable as a trigger for synchronized transmission of a second electronic article surveillance system.

Filtering of the line phase error where the first numerically controlled oscillator is responsive to a filtered line phase error and filtering the transmit phase error where the second numerically controlled oscillator is responsive to a filtered transmit phase error can also be implemented.

The first phase locked loop may further include a counter that is responsive to the crystal oscillator, and a readable capture register that is responsive to the power line zero crossing and to an output of the counter. The readable capture register output is the line phase error. A processor responsive to the power line zero crossing, to the line phase error, and to a power line phase locked loop interrupt can be used to select a value for a programmable period register. A comparator can be used for comparing the output of the counter and the value of the programmable period register. The comparator can be used to reset the counter and for sending the power line phase locked loop interrupt to the processor.

The second phase locked loop can include a counter having an output and comparators for comparing the counter output to each of four programmable registers. The comparators can generate four compare interrupts sent to the processor.

Objectives, advantages, and applications of the present invention will be made apparent by the following detailed description of embodiments of the invention.

DETAILED DESCRIPTION OF THE INVENTION

Figure 1:
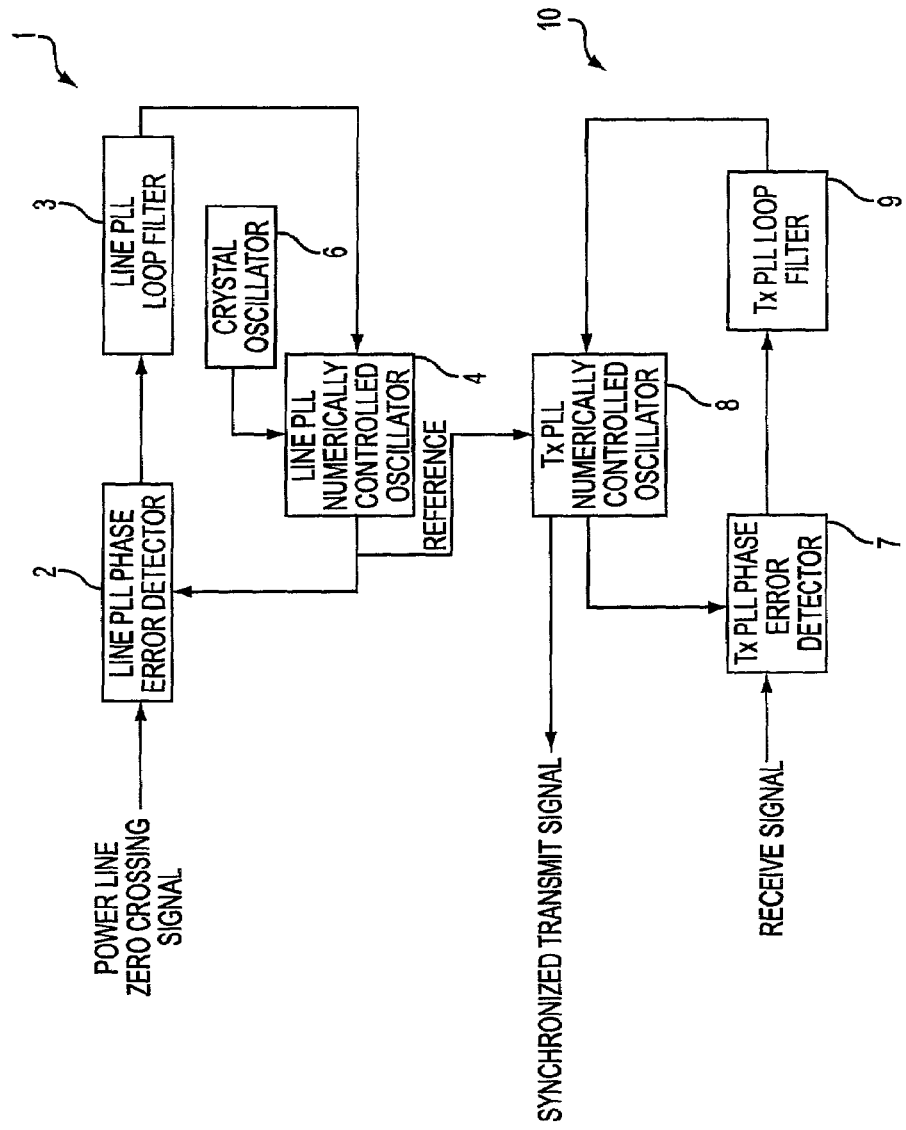
FIG. 1 is a block diagram of one embodiment of the present invention.

Referring to FIG. 1, one embodiment of the present invention is illustrated as implemented in a pulsed EAS system and includes generally two phase locked loops 1 and 10, which can be referred to as an outer or independent loop 1 and an inner or dependent loop 10. In independent loop 1, the power line zero crossing signal from the power line connected to the EAS system is input to the line phase locked loop (PLL) error detector 2. The output of line PLL error detector 2 is connected to line PLL filter 3, the output of which is connected to line numerically controlled oscillator (NCO) 4. Line NCO 4 is responsive to the reference frequency from crystal oscillator 6 and to the output of line PLL filter 3. Crystal oscillator 6 includes any oscillator sufficiently stable to provide a suitable reference. The output of line NCO 4 is input to line PLL error detector 2, and is used as a reference for transmit PLL NCO 8. In dependent loop 10, a received signal from the EAS system's receive antenna, which is a signal received from adjacent EAS systems, is input to a transmit PLL phase error detector 7. The output of transmit PLL error detector 7 is connected to transmit PLL filter 9, the output of which is connected to transmit PLL NCO 8. Transmit PLL NCO 8 is responsive to the reference from independent loop 1 and the output of transmit PLL filter 9. The output of PLL NCO 8 is input to transmit PLL error detector 7, and as the trigger for the transmit burst. In loops 1 and 10, in one embodiment for example, even numbered reference numerals indicate items that are preferably implemented in hardware and odd numbered reference numerals indicate items that are preferably implemented in software.

Figures 2, 3:
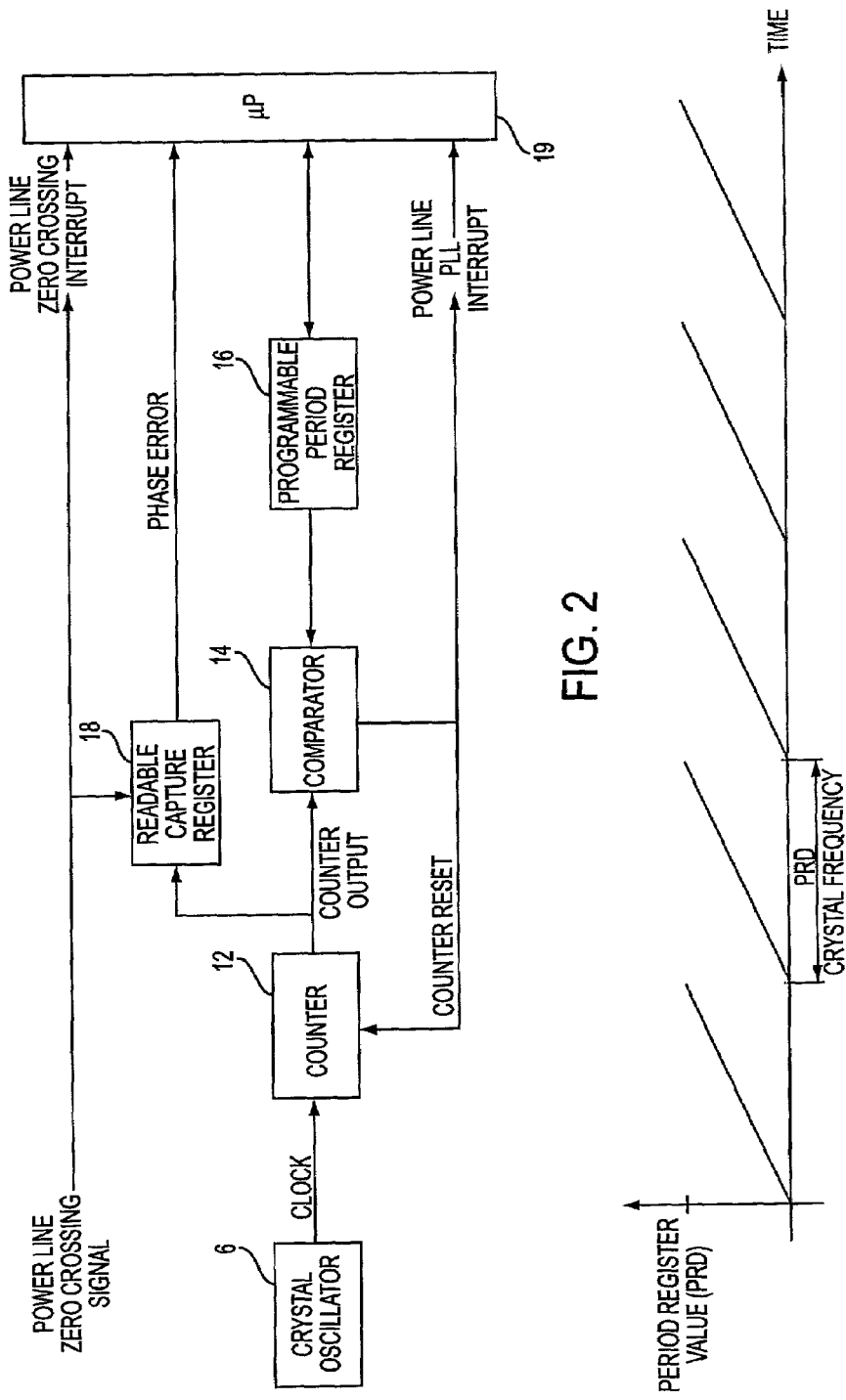
FIG. 2 is a block diagram of one embodiment of the numerically controlled oscillator and phase error detector used for the power line phase locked loop.
FIG. 3 is a plot of the output waveform of the numerically controlled oscillator shown in FIG. 2.

Referring to FIG. 2, one embodiment for the NCO and phase error detector for the line PLL is illustrated. The main components of this subsystem are the counter 12 and comparator 14. Counter 12 increments up from zero by one on each clock input from crystal oscillator 6. The programmable period register 16 and the counter output are inputs to the comparator 14. When the two inputs are equal, the comparator 14 sends an output to the counter 12 to reset back to zero. The output waveform of the NCO is illustrated in FIG. 3 for open loop operation (i.e., the period register 16 is not being updated by the loop filter output). The comparator 14 output is also sent as an interrupt to the microprocessor 19 to take its action as loop filter. Finally, the capture register 18 serves as a phase error detector. The value of the counter 12 at the time the zero crossing event occurs is a measure of phase error between the NCO and the actual line voltage waveform.

Figure 4:
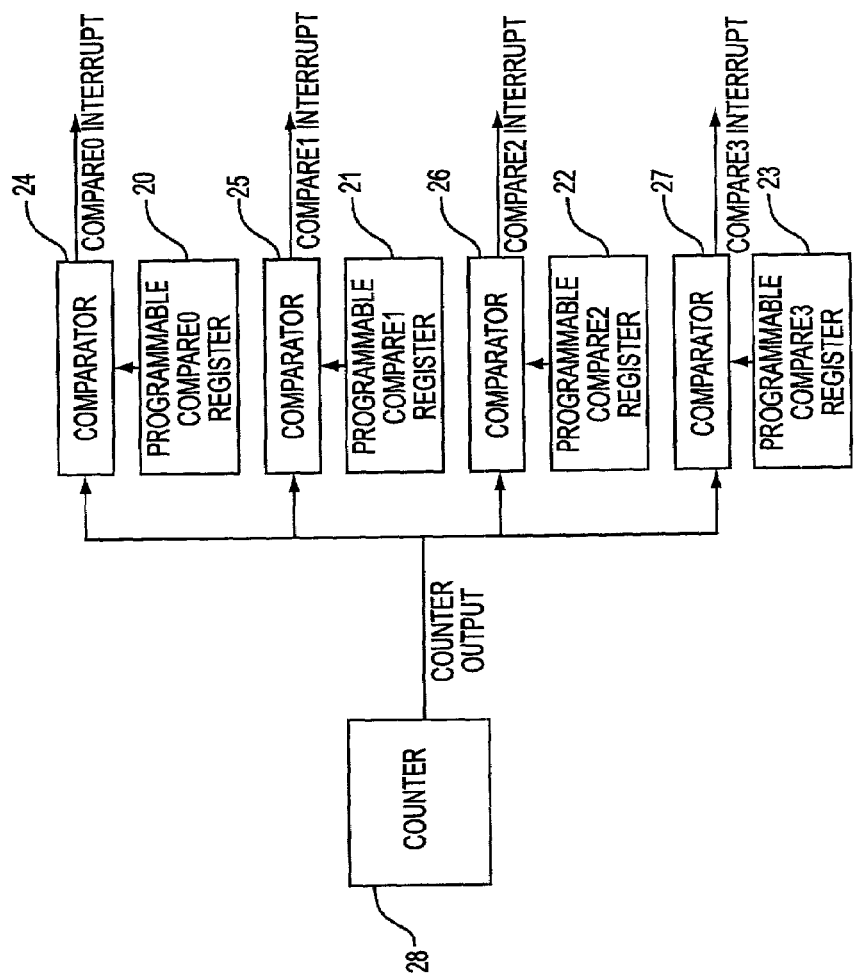
FIG. 4 is a block diagram of the numerically controlled oscillator for the transmitter phase locked loop.
Figure 5:
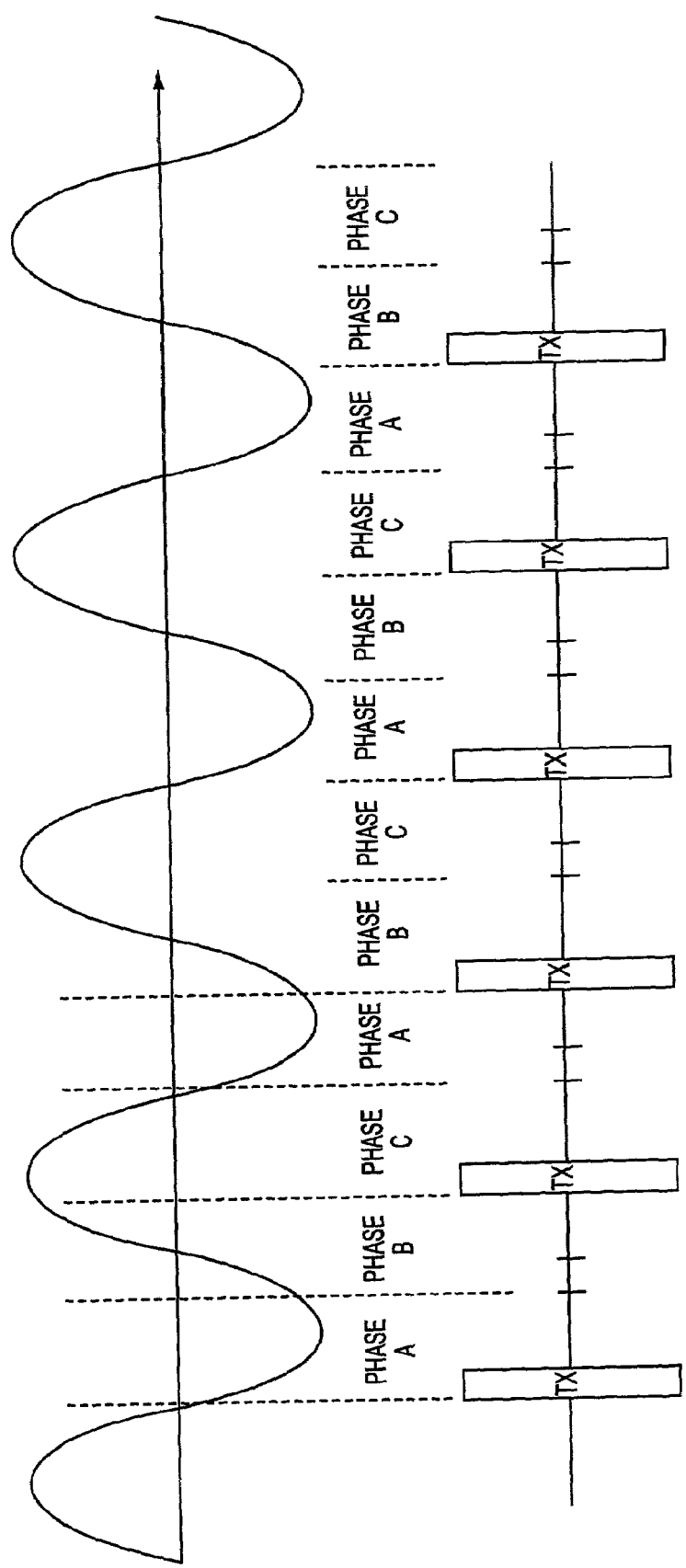
FIG. 5 is a timing diagram showing transmit pulses and the power line voltage with phases A, B, and C.

Referring to FIG. 4, the NCO for the transmitter PLL is illustrated. The "phase A", "phase B", and "phase C" event times, as shown in FIG. 5 and fully described below, are determined by compare registers 20–23, comparators 24–27, and counter 28. There are four compare events for when the line period and transmit burst period are not commensurate, and when the transmit burst period is less than one-third the line period, as fully explained below in the transmitter PLL operation.

Referring back to FIGS. 1 and 2, the following describes the power line phase error detector 2. As with any PLL, we assume that the actual power line frequency is not too far off from the nominal value (e.g., 60 Hz). This is in fact true, since the power line frequency is typically very accurate even thought it does exhibit considerable phase noise. The power line zero crossing signal triggers the capture register 18 to hold the current contents of the counter 12 and also generates an interrupt to the processor 19. The processor 19 responds with its interrupt service routine. The interrupt service routine software runs the control update algorithm and the power line loop filter 3.

The current value of the programmable period register 18 is denoted p(n), where (n) is the line PLL sample index. The value of the capture register 18 at sample time (n) is denoted x(n). We assume that if x(n)>p(n)/2, then the zero crossing signal occurred earlier than expected, otherwise it occurred later than expected. In other words, the zero crossing phase error signal, denoted e(n), is expressed as $$e(n)=x(n)-p(n),$$

if x(n)>p(n)/2, otherwise it is $$e(n)=x(n).$$

The line PLL makes use of a combination proportional and integral controller, where the two controller outputs are summed together, this can be written as $$c(n)=g_p(n)+g_i(n)$$

The proportional controller output is simply a gain ($A_1$) times the phase error, or $g_p=A_1 * e(n)$. After experimenting with several integrator schemes, the integrator chosen sums the past controller output c(n−1) with a gain times the present phase error, or $$g_i(n)=c(n-1)+A_2*e(n).$$

This type of proportional controller yields good performance and is computationally simple. In order to prevent the magnitude of the proportional controller output from getting too large during a transient or unlocked period, a limiter is utilized on $g_1(n)$.

The total controller output is therefore $$c(n)=A_1*e(n)+c(n-1)+A_2*e(n)$$

If the loop lock detector has determined the loop is locked, this total controller output is filtered with a short fir filter. (This filter is the only difference in the PLL implementation in the locked versus unlocked cases.) In either case, the nominal line period length is added to this value c(n), the value is limited to prevent the loop from locking to a harmonic, and the final value is written to the programmable period register 16.

The line PLL lock detector checks the magnitude of c(n) each line cycle. Each time c(n) is smaller than some threshold, a counter is incremented. If c(n) is larger than the threshold, the counter is decremented. If the counter gets above an experimentally determined level, the loop is considered locked. If it drops below another experimentally determined level, it is considered unlocked.

Referring again to FIG. 4, the transmitter PLL is considerably more complex than the line PLL. It is a distributed PLL, where multiple pulsed EAS systems, such as ULTRA*MAX systems, in proximity to one another phase lock to each others' transmit signal. Each system has identical but separate control algorithms, i.e., there is no master system keeping time.

Referring to FIG. 5, all ULTRA*MAX systems adhere to a timing scheme which is tied to the power line frequency. For example, domestic systems using 60 Hz power have a transmitter burst repetition rate that is some submultiple of 180 Hz, e.g., 30 Hz, 45 Hz, 60 Hz, or 90 Hz. This is based on the three phase implementation of the power line distribution system. Typical system timing is shown in FIG. 5 where the system is running at 90 Hz repetition rate. The basic time interval is the "line phase", which is the power line period divided by 3. The phases are called (arbitrarily) "A", "B", and "C". The transmitter fires for 1.6 milliseconds at the beginning of one phase, then listens for a tag response. During the following phase the transmitter does not fire, but listens to the noise environment. The transmitter fires every other line phase. Other examples would be to fire every third line phase, every fourth line phase, or every sixth line phase. A line phase in which the transmitter fires is a "transmit phase", while a line phase in which the transmitter does not fire is a "noise average phase".

Figure 6:
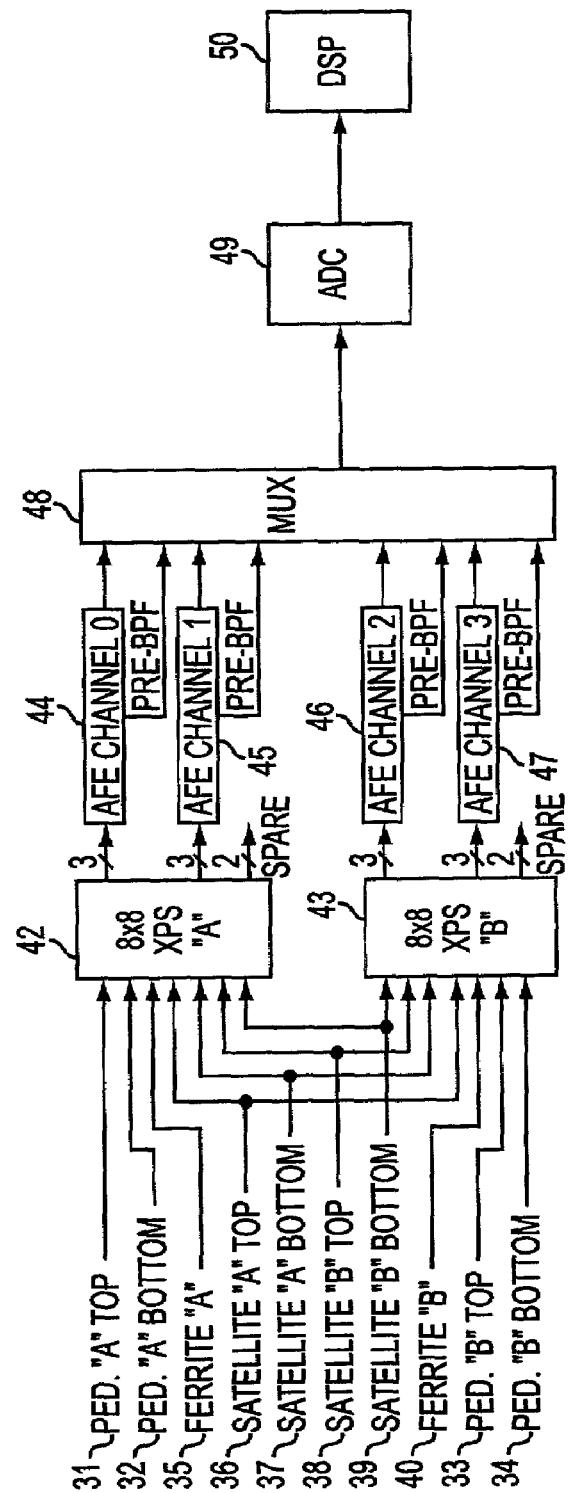
FIG. 6 is a block diagram of one embodiment for the hardware of the receiver section.

Referring to FIG. 6, each conventional ULTRA*MAX system implementing the present invention can use existing receiver hardware to look for adjacent system transmitters. The same receiver hardware is used to detect tags, so there is virtually no additional hardware cost incurred in an existing system to implement the present invention. There can be four transceiver (transmit and receive) antennas 31–34, and six passive antennas 35–40, which are combined 42, 43, into four analog front-end (AFE) channels 44–47. Note that there can be more receive antenna inputs than there are AFE channels. If this is the case, the system control software will interrogate the various receive antennas in a "round robin" fashion. The analog front-end channels 44–47 are multiplexed 48, sampled by an analog to digital converter (ADC) 49, and passed into the digital signal processing (DSP) subsystem 50.

Figure 7:
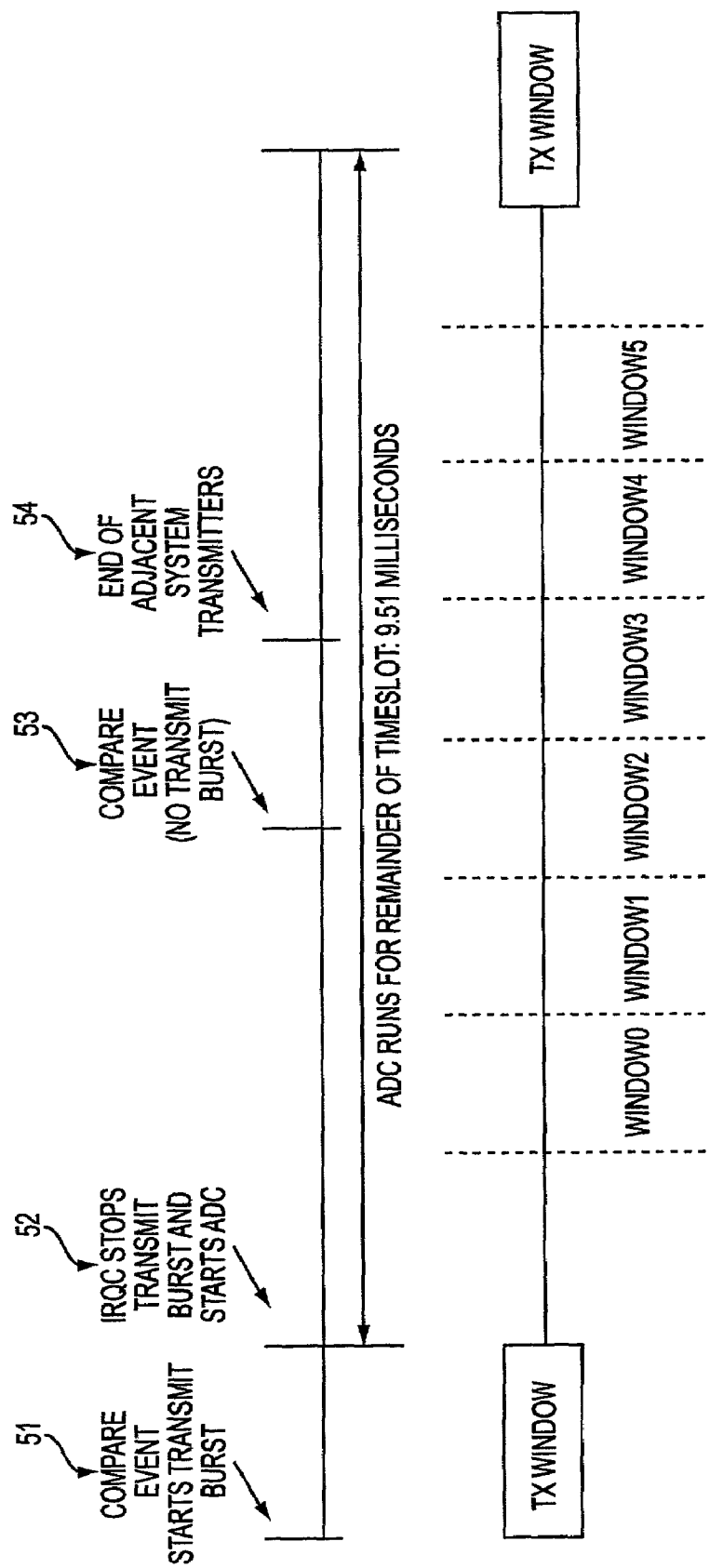
FIG. 7 is a timing diagram showing transmit and receive windows.

Referring also to FIG. 7, the software defines the combination of a transmit phase and a noise average phase, as defined above and shown in FIG. 5, as a "time slot". The compare events from the transmitter PLL NCO 8, and comparators 24–27 in FIG. 4, generate interrupts to the processor. These compare events indicate the beginning of the next line phase. If the new line phase is a transmit phase, then a transmit burst is started, otherwise no transmit burst is started. In a transmit phase, a 1.6 millisecond transmit burst is generated at 51. At the end of the burst, an interrupt is generated 52 which triggers the ADC circuitry 49 to begin sampling the four analog front end channels 44–47, and pass the samples into buffers in the DSP memory 50. The ADC 49 continues to sample through the remainder of the time slot until the next transmit burst is to be generated (about 9.51 millisecond for a 60 Hz line voltage). During this time a second compare event 53 will also occur, but this corresponds to the start of a noise average phase, so no transmit pulse is started. The ADC 49 samples the receiver during this time so that adjacent system transmitters 54 can be sensed.

There are many ways to implement the phase error detector for the transmitter PLL. In a white Gaussian noise environment, the optimum detector would be a bank of quadrature matched filters matched to the ULTRA*MAX transmitter signal. The peak output in time could be located and taken as the position of the adjacent systems' transmitters. The environment is not additive white Gaussian noise, but simple nonlinearities could be added to the filtering to achieve good performance. However, the computational requirements of this approach are very high. An alternative approach is an energy balancing scheme, or "early/late" phase error detector. In this approach the energy of the adjacent systems' transmitters is attempted to be kept balanced around the optimum center point in time of where the transmitters should be. Both the quadrature matched filter bank approach and the early/late detector approach have been analyzed and simulated. When the adjacent system signals are weak, the matched filter approach is far superior. However, when the signals are strong there is little difference in performance. Because the early/late detector is so much simpler, it is used for implementation of the auto-synchronization disclosed herein.

Returning to FIG. 7, the six windows, denoted "window(0)" through "window(5)" represent how the receive ADC samples are segmented for the purpose of detecting the energy of adjacent system signals. Note that the boundary of window(2) and window(3) is precisely the center point of where the adjacent system transmit signals should be 54. That is, assuming the transmitter PLL is locked then half of the adjacent transmit signal will be in window(2) and half will be in window(3).

The first part of the transmit PLL phase error detector and loop controller is to calculate the energy in each of the windows for each of the receive antennas connected to the AFE channels 44–47. For shorthand notation, let (a) denote the antenna, (w) denote the window (0 through 5), and (m) is a sample time index. The energies calculated on antenna (a), for window (w) at sample time (m) are denoted Energy (a,w,m). The next part of the phase error detector is to sort, or rank, the energies from largest to smallest. The sorted array of energies are denoted RankEnergy(a,k,m), where the window index has been changed to (k) to indicate the new ordering. The mapping from the time ordered energies Energy(a,w,m) to the magnitude ordered energies RankEnergy(a,k,m) is given by RankIndex(a,k,m). That is, if window number 2 had the most energy, then RankEnergy(a,0,m)=2.

Some other statistics are also calculated for the transmitter PLL. The ratio of energy in the early window (window 2) to late energy (window 3) is defined as EarlyLateRatio(a,m)=Energy(a,2,m)/Energy(a,3,m).

The ratio of the largest energy window to the third largest window energy is defined as SNR1(a,m)=RankEnergy(a,0,m)/RankEnergy(a,2,m).

When the transmit PLL is locked, all of the transmit energy will be in the two center windows. The third largest window is noise only, although it is the strongest noise window. The weakest noise window is RankEnergy(a,5,m).

The ratio of the largest energy window to the fourth largest window is denoted

SNR2(a,m)=RankEnergy(a,0,m)/RankEnergy(a,3,m).

When the PLL is not in lock, the transmit signal may be in up to three windows simultaneously. In this case SNR2 is a ratio of the window with the most transmit energy present to the largest noise only window. The ratio of the largest energy window to the weakest energy window is denoted SNR3(a,m)=RankEnergy(a,0,m)/RankEnergy(a,5,m).

Finally, the energies calculated in the six windows are averaged over time using single-pole low pass filters to produce estimates of the average energy in each window for each antenna. These average values are denoted, EnergyLPF(a,w,m).

These values are used to detect changes in the environment.

Figure 8:
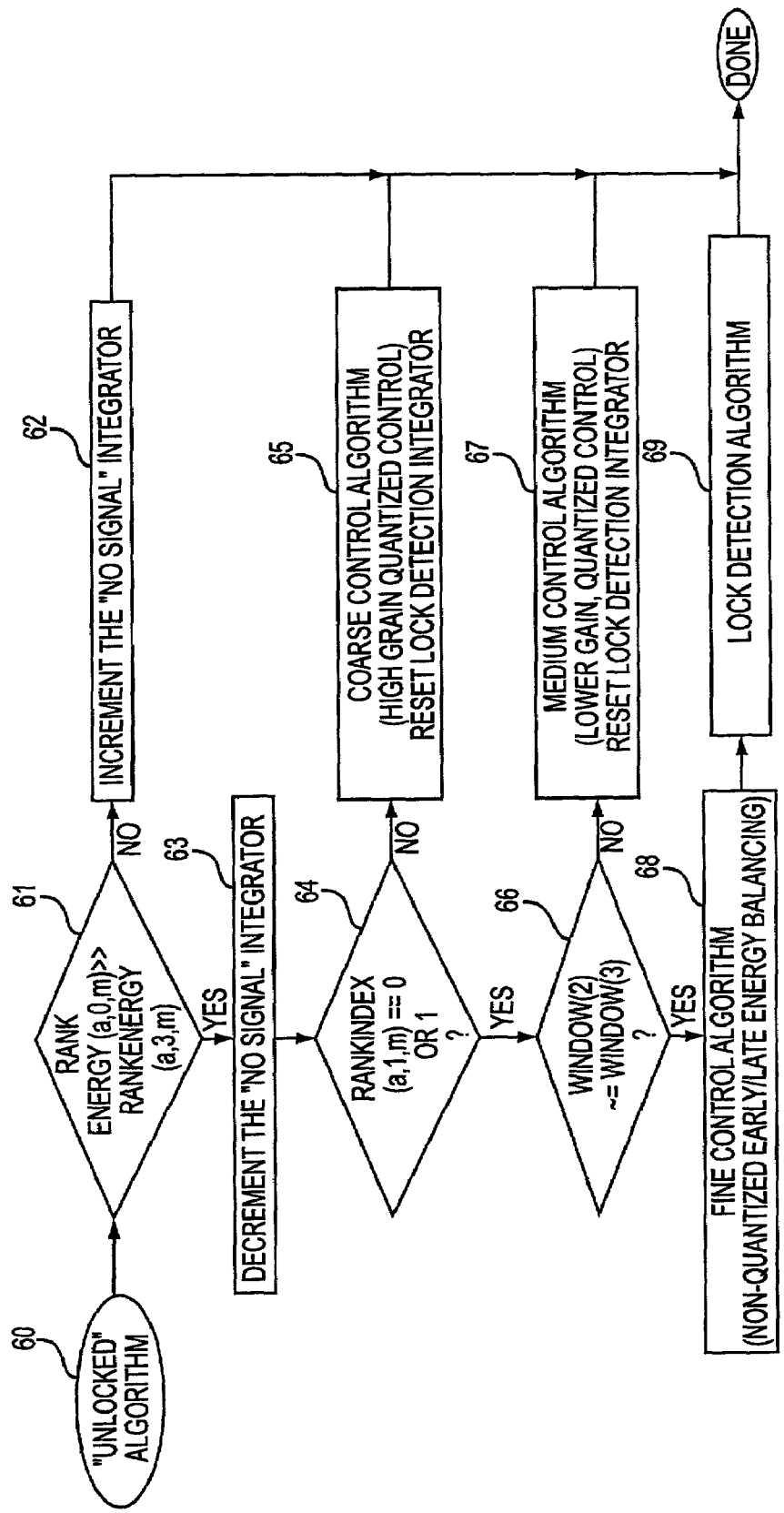
FIG. 8 is a flow chart showing the transmitter phase locked loop controller while unlocked.

Referring to FIG. 8, initially, in the acquisition mode, line PLL must first acquire and become locked. After the line PLL has become locked, then the transmit (TX) PLL starts at 60. On each time slot, the acquisition mode TX PLL controller is run for each receiver antenna that has been sampled by the ADC 49 for that time slot. The software first checks for exceptional situations: no signal is present or too many signals are present at 61. If RankEnergy(a,0,m) is not>>(much greater than) RankEnergy(a,3,m), then the "no signal" integrator is incremented at 62, if RankEnergy(a,0,m)>>(is much greater than) RankEnergy(a,3,m), then the "no signal" integrator is decremented at 63. If the "no signal" integrator exceeds a specified threshold on all of the sampled receive antennas, then the system inserts a forced noise average following the current time slot. This makes the transmitter skip two line phases, instead of just one. The result is that any adjacent systems that were transmitting simultaneously (and thus cannot be seen by the receive antennas) are now transmitting one line phase off (and thus can be seen by the receive antennas). If there are too many signals, i.e., the systems see multiple transmit signals, which are not synchronized, the system can be locked to the highest signal. After this, the software checks two conditions to determine whether it should run high (coarse), medium, or low (fine) gain acquisition controllers.

If RankIndex(a,1,m) is not equal to window(0) or window(1) at 64, then the coarse gain controller is selected at 65. The coarse gain controller uses the equation:

C(a,m)=[2·RankIndex(a,0,m)−5]·10000, where C(a,m) is the control value calculated from antenna (a) on the (m)$^{th}$ timeslot. This control value is used to update the TX NCO compare registers 20–23, shown in FIG. 4. This control value has a maximum value of 50000 and a minimum value of −50000. Since the crystal oscillator driving the counter is 40 Mhz, these values correspond to +/−50000/40e6=+/−1.25 milliseconds of time shift for the transmitter NCO compare events.

If RankIndex(a,1,m) is equal to window(0) or window(1) at 64, and window(2) is not approximately equal to window(3) at 66, then the medium gain controller is selected at 67. The medium gain controller uses the equation:

C(a,m)=[2·RankIndex(a,0,m)−5]·2000.

This control value has a maximum value of 5000 and a minimum value of −5000. These values correspond to +/−2000/40e6=+/−250 microseconds of time shift for the transmitter NCO compare events.

If RankIndex(a,1,m) is equal to window(0) or window(1) at 64, and window(2) is approximately equal to window(3) at 66, then the fine gain controller is selected at 68. The fine gain controller uses the equation:

C(a,m)=sign(Energy(a,3,m)−Energy(a,2,m))·500.

This control value has a maximum value of 500 and a minimum value of −500. These values correspond to +/−500/40e6=+/−12.5 microseconds of time shift for the transmitter NCO compare events.

If the high or medium gain controllers are run, then the lock integrator is reset to zero at 65 or 67, respectively. Otherwise, when the low gain controller is run at 68, the lock detection routine is called at 69.

Figure 9:
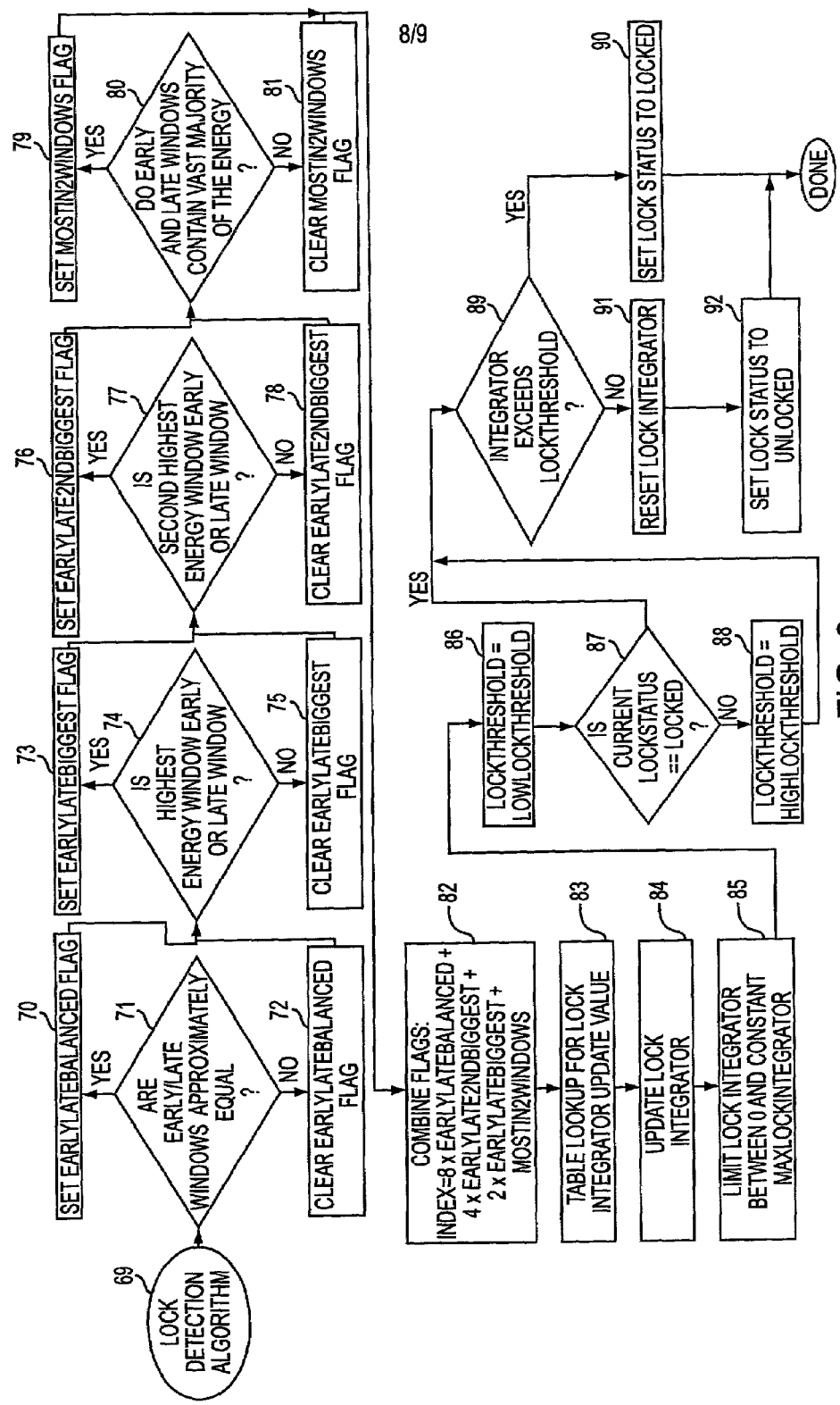
FIG. 9 is a flow chart showing the lock detection algorithm.

Referring to FIG. 9, the lock detection algorithm is called at 69. The lock detection algorithm is run for each antenna that has been sampled by one of the four AFE channels 44–47, as shown in FIG. 6 (i.e., if an antenna is not being received on by an AFE channel, then the TX PLL does not run on that antenna). The first section of the algorithm sets four flags that collectively give an indication of how well the system is synchronized. The EarlyLateBalanced flag is set at 70 if Energy(a,2,m) and Energy(a,3,m) are within 3 dB of each other at 71, or else cleared at 72. The EarlyLateBiggest flag is set at 73 if RankIndex(a,0,m) is equal to 2 or 3 at 74, or else cleared at 75. The EarlyLate2ndBiggest flag is set at 76 if RankIndex(a,1,m) is equal to 2 or 3 at 77, or else cleared at 78. The MostIn2Windows flag is set at 79 if RankEnergy(a,1,m) is much larger than RankEnergy(a,2,m) at 80, or else cleared at 81.

Next at 82, the flags are combined together by the equation:

Index=8×EarlyLateBalanced+4×EarlyLate2ndBiggest+2×EarlyLateBiggest+MostIn2Windows, and used as an index into a "lock integrator update" table at 83. The "lock integrator update" table is shown in the following table.

| Index | Status | Integrator Update |
|---|---|---|
| 0 | Timing is way off | −1024 |
| 1 | Timing is way off | −1024 |
| 2 | Timing is getting close | +4 |
| 3 | Timing is getting close | +4 |
| 4 | Timing is getting close | +4 |
| 5 | Timing is getting close | +4 |
| 6 | Timing is getting very close | +32 |
| 7 | Timing is getting very close | +32 |
| 8 | Timing is way off | −1024 |

-continued

| Index | Status | Integrator Update |
|---|---|---|
| 9 | Timing is way off | −1024 |
| 10 | Timing is getting very close | +32 |
| 11 | Timing is getting very close | +32 |
| 12 | Timing is getting very close | +32 |
| 13 | Timing is getting very close | +32 |
| 14 | Timing is getting very close | +32 |
| 15 | Timing is locked | +128 |

The integrator update from the "lock integrator update" table is added to the integrator at 84. The integrator is limited between 0 and MaxLockIntegrator, and nominally set to 16384, at 85. To provide hysteresis, there are two lock thresholds for the integrator. LowLockThreshold, nominally set to 8192, is set at 86 when the loop is locked at 87. HighLockThreshold, nominally set to 12288, is set at 88 when the loop is unlocked at 87. When th integrator exceeds the LockThreshold at 89 the lock status is set to "locked" at 90. When the integrator does not exceed the LockThreshold at 89 the lock integrator is reset at 91 and the lock status is set to "unlocked" at 92.

The locked mode controller uses the equation $$C(a,m) = \text{sign}(\text{Energy}(a,3,m) - \text{Energy}(a,2,m)) \cdot 100.$$

This control value has a maximum value of 100 and a minimum value of −100. These values correspond to +/−100/40e6=+/−2.5 microseconds of time shift for the transmitter NCO compare events.

On any given time slot, up to four receive antennas 31–40 may have been sampled by the DSP 50, as shown in FIG. 6. Likewise, these same receive antennas would have the Tx PLL phase error detection and loop controller run on their sampled receive data. Given that the different receive antennas will have different noise characteristics and will receive adjacent system transmit signals with different strengths, the question is: how do we combine their phase detector/loop controller outputs?

If one were to devise criteria of goodness for the antenna combiner it may (or it may not) be possible to analytically derive an optimum combiner. Of course, this combiner would only be optimum for the criteria stated and assumptions used. If the environmental assumptions turned out to be inaccurate, there is little reason to believe the solution would still be optimum. Indeed, if the methods used are not robust, the resulting combiner could be very poor if the true system deviated from the model used. Also, the original criteria may not capture all of the qualities we want in the combiner.

It is important to realize what we have is a problem in antenna diversity combining. Considerable theoretical work and system implementation have been done in the fields of detection and estimation on antennas combining. Any of these results could be adapted to our approach. A commonly used "suboptimum" approach is choosing the antenna with the highest signal to noise ratio, and using this one all by itself. This method is suboptimum in performance, but is far less complex than the optimum combiner, which is why it is used so often. It turns out that in reasonably high SNR environments, the performance difference is usually quite small.

Figure 10:
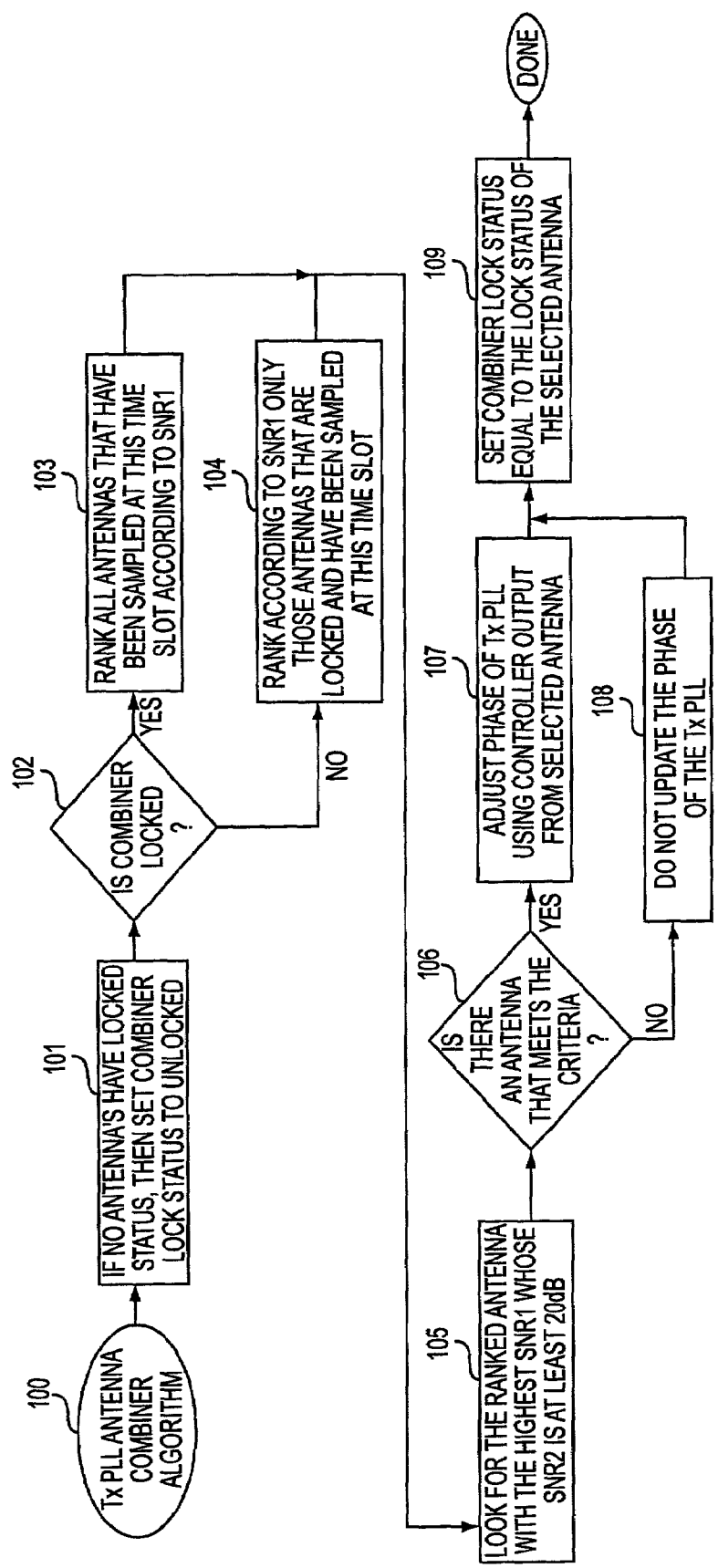
FIG. 10 is a flow chart showing the transmitter phase locked loop antenna combining algorithm.

Referring to FIG. 10, one embodiment for the antenna-combining algorithm is illustrated, starting at 100. If none of the individual receive antennas are locked, the antenna combiner is set to unlocked at 101. Next, if the combiner is locked at 102 it ranks all of the locked antennas, which were sampled in this time slot, according to SNR1, at 103. Otherwise (if the combiner is not locked) all of the receive antennas which were sampled this time slot are ranked by SNR1, at 104. Following this ranking procedure, the algorithm looks for the highest ranked receive antenna with SNR2 greater than 20 dB at 105. If such an antenna is found at 106, it is selected as the antenna with which to synchronize at 107, and the phase of transmitter PLL is adjusted accordingly. If no such antenna is found, the combiner does not update the Tx PLL phase at all at 108. The lock status of the combiner is set to the lock status of the selected antenna at 109.

The system can handle exceptional situations in operation. One problem encountered is that all EAS systems in proximity to one another may not be running off of the same power line frequency. This is the case if some stores within a mall are running off of a generator, while others are running off of different generators or the power line. In this situation, there will be a frequency offset between the transmitter repetition rates that must be tracked by the TX PLL. For example, one set of systems may be running at 90.1 Hz repetition rate, while another set may be running at 89.8 Hz repetition rate. This frequency offset must be tracked out by the TX PLL.

Two solutions are possible. First, the controller's gain can be increased so that the lock bandwidth of the PLL is high enough. However, increasing the PLL's bandwidth in this way also increases the steady state jitter due to noise. The second approach is to increase the order of the PLL, i.e., adding an integral term in the controller to track the frequency offset.

Another exceptional situation occurs when the transmit PLL is unable to lock. Perhaps it can see the other system's transmitters (sometimes), but due to excessive noise it is not able to achieve lock. Tag signals also may be affecting the energy content in many of the synchronization windows. Several options are available. First, have the antenna combiner criteria select antennas that see little or no tag signal or interfering noise. Second, the transmitter can occasionally be shut off to remove the tag signal or transmitter induced noise. Third, use a comb notch filter (ring down canceller) to remove stationary tags in the interrogation zone.

It is to be understood that variations and modifications of the present invention can be made without departing from the scope of the invention. It is also to be understood that the scope of the invention is not to be interpreted as limited to the specific embodiments disclosed herein, but only in accordance with the appended claims when read in light of the forgoing disclosure.

What is claimed is:

1. Apparatus for wireless synchronization of electronic article surveillance systems, reducing the need for manual adjustment of transmitter timing by continually adapting and updating timing automatically to changing environmental conditions, comprising:

a first phase locked loop including:

means, responsive to a power line zero crossing, for detecting a line phase error;

a first numerically controlled oscillator responsive to said line phase error and to a crystal oscillator, said first numerically controlled oscillator and having a reference output, said reference output being an input to said line phase error means; and, a second phase locked loop including:

means, responsive to a transmit signal from a first electronic article surveillance system, for detecting a transmit phase error; and, a second numerically controlled oscillator responsive to said transmit phase error and said reference output; said second numerically controlled oscillator having a synchronized transmit output, said synchronized transmit output being an input to said transmit phase error means; and, wherein said synchronized transmit output being usable as a trigger for synchronized transmission of a second electronic article surveillance system.

2. The apparatus of claim 1 further comprising means for filtering said line phase error wherein said first numerically controlled oscillator being responsive to a filtered line phase error and means for filtering said transmit phase error wherein said second numerically controlled oscillator being responsive to a filtered transmit phase error.

3. The apparatus of claim 2 wherein said first phase locked loop further comprises:
 a counter responsive to said crystal oscillator;
 a readable capture register responsive to said power line zero crossing and to an output of said counter, said readable capture register output being said line phase error;
 a processor responsive to said power line zero crossing, to said line phase error, and to a power line phase locked loop interrupt, said processor selecting a value for a programmable period register;
 comparator means for comparing the output of said counter and the value of said programmable period register, said comparator means further including means for resetting said counter and for sending said power line phase locked loop interrupt to said processor.

4. The apparatus of claim 3 wherein said second phase locked loop further comprises a counter having an output and comparator means for comparing said counter output to each of four programmable registers and generating four compare interrupts.

5. A method for wireless synchronization of electronic article surveillance systems, reducing the need for manual adjustment of transmitter timing by continually adapting and updating timing automatically to changing environmental conditions, comprising:
 detecting a power line zero crossing and a reference output from a first numerically controlled oscillator to provide a line phase error signal;
 said first numerically controlled oscillator receiving said line phase error signal and an oscillator signal and generating said reference output; and,
 detecting a transmit signal from a first electronic article surveillance system and a synchronized transmit output from a second numerically controlled oscillator to provide a transmit phase error;
 said second numerically controlled oscillator receiving said transmit phase error and said reference output and generating said synchronized transmit output, wherein said synchronized transmit output being usable as a trigger for synchronized transmission of a second electronic article surveillance system.

6. The method of claim 5 further comprising filtering said line phase error and filtering said transmit phase error.

7. An electronic article surveillance system incorporating wireless synchronization of a plurality of electronic article surveillance systems, reducing the need for manual adjustment of transmitter timing by continually adapting and updating timing automatically to changing environmental conditions, comprising:
 an electronic article surveillance transmitter and receiver and at least one antenna connected to the transmitter and receiver, said transmitter including:
 a first phase locked loop including:
  means, responsive to a power line zero crossing, for detecting a line phase error;
  a first numerically controlled oscillator responsive to said line phase error and to a crystal oscillator, said first numerically controlled oscillator and having a reference output, said reference output being an input to said line phase error means; and,
 a second phase locked loop including:
  means, responsive to a transmit signal from a first of a plurality of electronic article surveillance systems, for detecting a transmit phase error; and,
  a second numerically controlled oscillator responsive to said transmit phase error; said second numerically controlled oscillator having a synchronized transmit output, said synchronized transmit output being an input to said transmit phase error means; and,
 wherein said synchronized transmit output being usable as a trigger for synchronized transmission of a second of said plurality of electronic article surveillance systems.

* * * * *